INVENTOR.
George A. Doyle

BY Mueller & Aichele

ATTY'S.

INVENTOR.
George A. Doyle
BY Mueller & Aichele
ATTY'S.

United States Patent Office 3,367,025
Patented Feb. 6, 1968

3,367,025
METHOD FOR FABRICATING AND PLASTIC ENCAPSULATING A SEMICONDUCTOR DEVICE

George A. Doyle, Scottsdale, Ariz., assignor to Motorola, Inc., Franklin Park, Ill., a corporation of Illinois
Continuation of application Ser. No. 337,849, Jan. 15, 1964. This application Nov. 4, 1966, Ser. No. 592,236
8 Claims. (Cl. 29—588)

ABSTRACT OF THE DISCLOSURE

A semiconductor device employing a semiconductor member, metal leads, and wire connections between such member and the respective leads is fabricated, and is encapsulated in plastic by a one-step transfer molding operation with a portion of each of the leads extending from the encapsulated portion.

This is a continuation of application Ser. No. 337,849, filed Jan 15, 1964, and now abandoned.

This invention relates to transistors and their fabrication. More particularly, it relates to an improved design and process for the manufacture of transistors at very low cost on a mass production basis.

Presently, in the manufacture of most low power transistors, a large portion of the manufacturing cost is due to the necessity of assembling the crystalline element to a glass-to-metal-seal header. It is often the case that the glass-to-metal-seal header cost is several times the cost of the rest of the components including the crystalline element.

There are less expensive headers available such as the plastic variety but from an economy standpoint it would be more desirable to eliminate the header entirely. However, since the reader normally serves as a base to which the crystal element is mounted and connected, an equivalent structure for purposes of assembly and for providing electrical connection to the finished device is required.

Accordingly, an object of this invention is to reduce transistor manufacturing cost by elimination of the header by providing a structure equivalent to a header for the purpose of assembling the transistor.

Other objects are to provide a structure equivalent to a header for the purpose of electrically connecting the transistor into an electrical circuit and to provide a structure for encapsulation and protection of the crystalline element and the electrical connections to it.

The sequential steps in the manufacture of the semiconductor device, and the mold for jigging the parts, and then encapsulating such semiconductor device, are illustrated in FIGS. 3A–3H inclusive, with the latter figure showing the completed encapsulated semiconductor device ready to be removed from the jig portion of the transfer mold.

Summarily described, the manufacturing process in accordance with this invention utilizes a transfer mold part as a jig for the fabrication of transistors. Formed wires are gripped, and held in proper location for transistor assembly on said transfer mold part. While the shaped wires are still firmly held by the transfer mold part, the crystalline semiconductor element is mounted and electrically connected to the shaped wires and given a passivating treatment. The transfer mold part is then fitted to the balance of the mold and the crystalline semiconductor element and the shaped portion of the wires are encapsulated in plastic in a transfer molding step. Removal of the encapsulated device from the mold and electrical testing thereof, completes the manufacture of the transistor.

Figure 1:
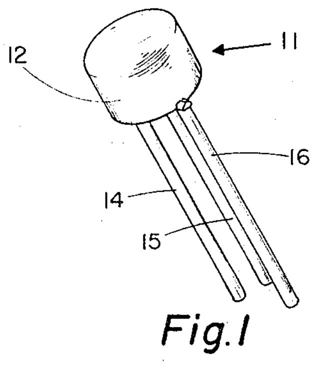
FIG. 1 is an enlarged view of a transistor made by the method of the invention.

FIG. 1 of the accompanying drawings illustrates a completed transistor 11 in accordance with the present invention. Visible is the body of plastic and the metal leads 14, 15, and 16 of gold plated copper. The view of FIG. 1 is shown for clarity several times larger than actual size.

Figure 2:
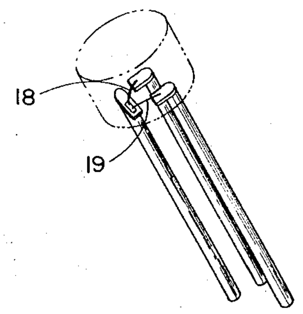
FIG. 2 is a view similar to FIG. 1 but showing the structure of the transistor within the plastic body, with the outside of the plastic body shown in dotted lines.

FIG. 2 is equivalent to FIG. 1 except that the semiconductor element of the transistor within the plastic body is visible. The dashed lines, of course, represent the outline of the plastic body. The end of the lead 14 on which the semiconductor element is mounted is bent and flattened as shown. Leads 15 and 16 are also bent and flattened; they are bent toward the active element so that the span of the tiny wires 18 and 19 which connect the leads to the emitter and base electrodes of the active element will be short.

To construct the transistor of FIG. 1, formed wire leads 14, 15, and 16 are placed in position between the three clamping parts 21, 22, and 23 of a stainless steel jig. The ends of the wires were cold headed into the bent-over and flattened form shown. The jig 24 is shown in Step A (FIG. 3A) with the three parts 21, 22, and 23 widely separated in an exaggerated manner in order to show the half-holes 25 which clamp and locate the wires for subsequent operations. In practice, the three clamping parts are separated just a few thousandths of an inch while the wires are inserted between the matching half-holes. Guide pins 27 maintain the half-holes 25 in alignment. Clamping of the wires is accomplished by tightening the cap-screw 29 to draw the three clamping parts of the jig together.

As shown in Step B (FIG. 3B), the wires 14, 15, and 16 are clamped in the configuration shown. The flats 30, 31, and 32 on the wires are positioned a given distance above the surface formed by the top portion of the three clamping parts. The flats 31 and 32 on wires 15 and 16 are in the same plane slightly above the flat 30 on wire 14. The flat 30 on wire 14 will serve as a mounting base for the crystalline semiconductor element. A semiconductor element 33 is shown mounted on the flat 30 of wire 14 in Step C. In a particular embodiment the crystalline semiconductor element is a structure having aluminum stripes 34 and 35 (electrodes) on the base and emitter regions and a gold plate on the opposite side of the semiconductor element. The semiconductor element is placed gold side down in the desired location on the flat 30 of wire 14 and they are pressed together and heated to about 380° C., cooled and the pressure removed thereby bonding the semiconductor element to the flat of the wire.

Figures 3A, 3B, 3C, 3D, 3E:
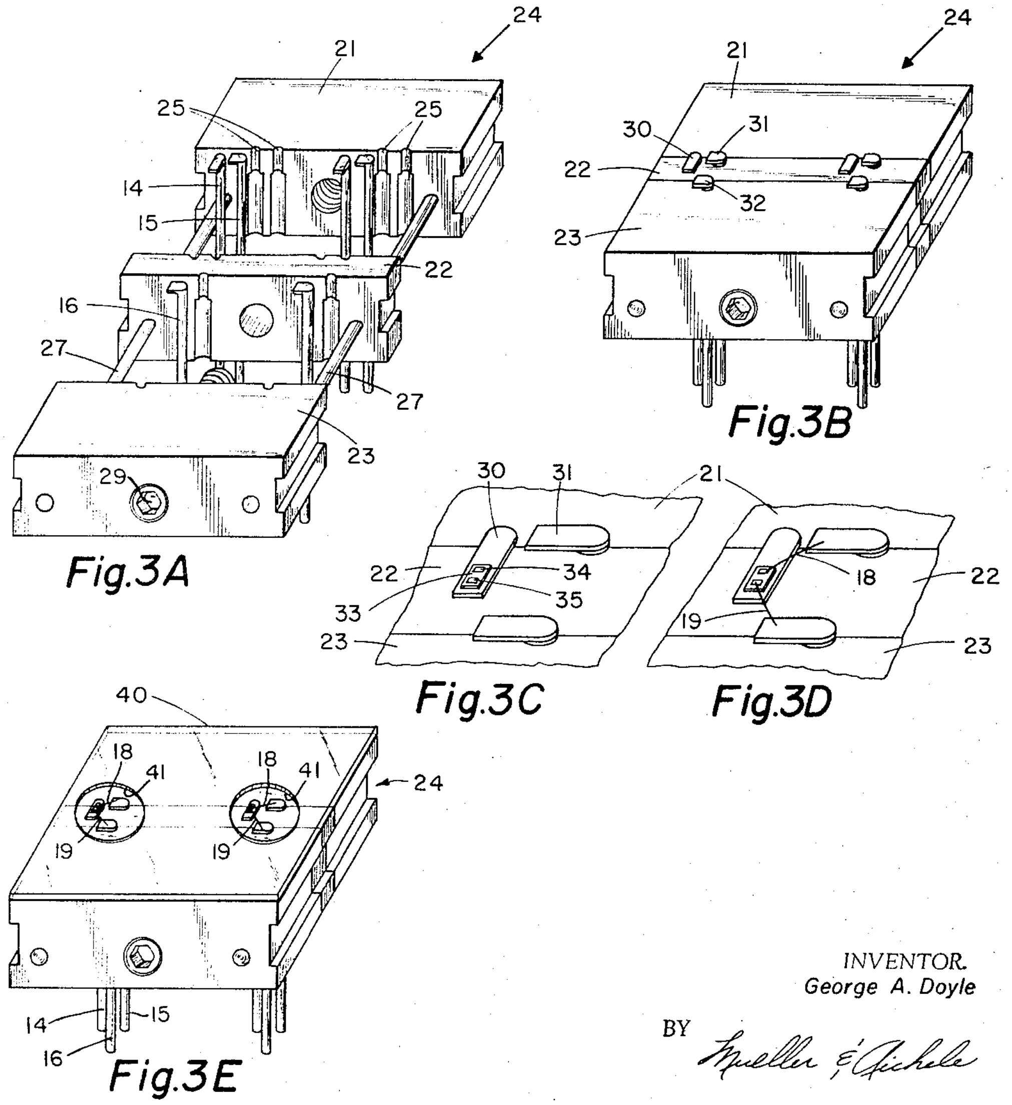
FIG. 3A shows the multipart portion of the metal transfer mold, with the parts of that portion in perspective, separated from one another an exaggerated amount, and showing the semiconductor device lead wires for a plurality of devices (two in this instance) in a suspended position within the exaggerated spacing between the parts.
FIG. 3B is a corresponding view of the mold parts of FIG. 3 in an assembled and secured position with the semiconductor device elements jigged therein.
FIG. 3C is a fragmentary illustration in enlarged form of the surface of the multipart mold portion and jig of FIG. 3B, with the semiconductor element and lead portions secured therein.
FIG. 3D is a corresponding illustration of the structure of FIG. 3C with tiny wires assembled on the contact stripes of the semiconductor element.
FIG. 3E is a view of the mold portion corresponding to that of FIG. 3B, but with the semiconductor device elements in the condition of FIG. 3D, and exposed through openings in a removable mask lying over the mold portion.

Fine aluminum wires 18 and 19 are thermocompression bonded to the aluminum stripes 34 and 35 of the semiconductor element 33 and the flats 31 and 32 of the lead wires 15 and 16 (Step D) (FIG. 3D). Since the ends of the flattened portion of the lead wires are close to the semiconductor element, the span of the fine wires may be kept quite short making the fine wires more difficult to break.

In Step E (FIG. 3E), a thin mask 40 is placed over the jig and a film of metallic oxide such as alumina is deposited through the opening 41 on the semiconductor element as well as the exposed portions of the wires and the jig. This both protects and passivates the semiconductor element. The deposition is accomplished by the method described in the copending application Serial No. 310,257, filed September 20, 1963, now abandoned, of David R. Peterson and assigned to the present assignee. The jig is placed on the conveyor belt of the apparatus described in Peterson's application and is kept free of oxide by the mask except where not covered by the mask.

Figure 3F:
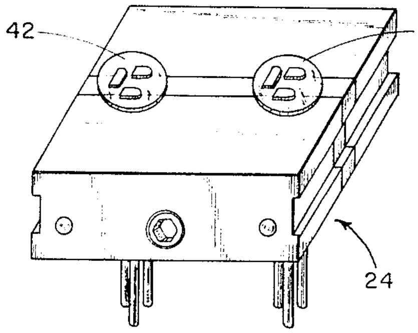
FIG. 3F illustrates some of the structure of FIG. 3E with the mask removed, and a passivating coating on each semiconductor device assembly.
Figure 3G:
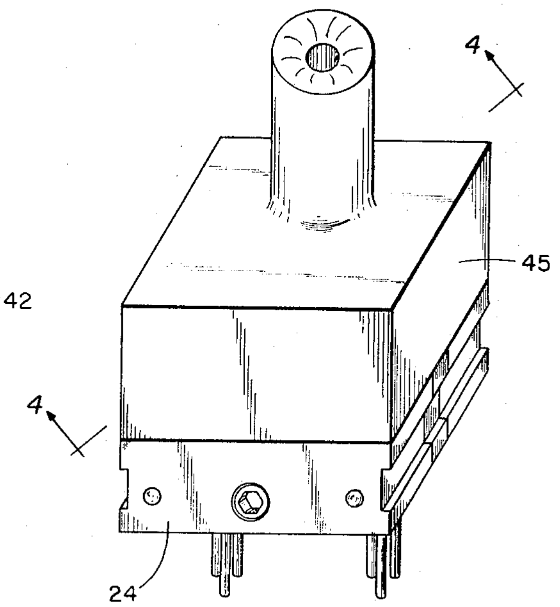
FIG. 3G shows the complete transfer mold in assembled position for introduction of plastic or encapsulate the assembled semiconductor device elements on the multipart mold portion.
Figure 3H:
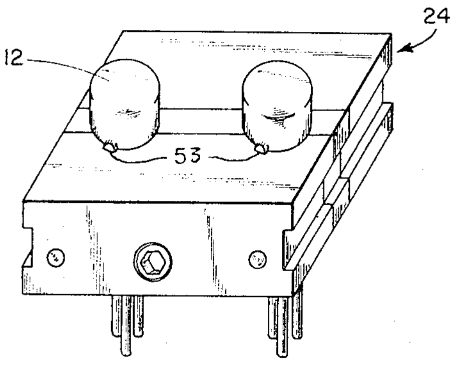
FIG. 3H shows the multipart mold portion, or jig, with the semiconductor devices therein after being encapsulated in plastic in a transfer molding operation.

The mold is shown after removal of the mask in Step F (FIG. 3F). The active element and all wires are covered as well by a small thin disk-shaped region 42 of alumina formed on the surface of the jig not covered by the mask. Because of drafting difficulties with the small elements, the stripes 34 and 35 on the semiconductor element, and the latter element itself are not shown, and for illustrative purposes the parts below the passivating coating 42 are shown in full lines rather than dotted.

Figure 4:
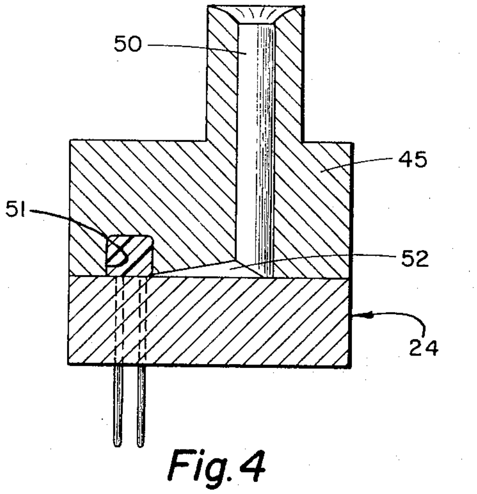
FIG. 4 is a sectional view, generally on the line 4—4 of FIG. 3G, showing each of the two portions of the transfer mold in position after encapsulating an assembled semiconductor device by a molding operation.

The jig is then transferred to a plastics transfer mold. The jig used thus far in assembly of the transistors now also serves as the lower part of the mold. The upper part of the mold 45 (Step G) (FIG. 3G) bears against the upper surface of the jig forming a seal and then plastic is formed about the active element 33 and the wires using well known transfer molding techniques. The transfer mold is shown in section in FIG. 4. Powdered plastic or preforms is introduced into the cylindrical cavity 50 where it becomes molten due to the temperature of the upper portion of the mold which is maintained in a heated condition. A piston (not shown) is pressed into the cylinder 50 and the plastic is transferred to the cavity 51 through the gate 52. The plastic within the cavity is shown through a portion outside the semiconductor element and leads of the encapsulated device, and in cross-section. It fills and solidifies in the cavity.

The plastic enclosure 12 is shown in step H (FIG. 3H), which shows the jig again after removal of the upper portion of the mold. The jig is then opened to release the lead wires. The device at this point is in the form shown as 11 in FIG. 1, with the integral lug 53 on the plastic enclosure. Post cure, electrical testing, classification and inspection complete the device.

What is claimed is:

1. In a method for manufacturing a semiconductor device which includes placing on a portion of a multiportion metal transfer mold semiconductor means and associated wire means and metal lead means, and encapsulating said semiconductor means and associated means in the transfer mold by only one molding operation for the complete manufacture, said method including (a) mounting metal lead means, wire means, and semiconductor means on one metal portion of a transfer mold with metal lead means maintained in said one metal portion and protruding therefrom, (b) bringing said one metal portion and a second metal portion of said transfer mold together when said transfer mold is closed for the molding operation and maintaining them securely together, with said wire means and a portion of said metal lead means and semiconductor means in a cavity formed by and between said two portions and entirely encompassed by the transfer mold, (c) introducing a molding plastic into said cavity in a single transfer molding operation to fill said cavity and entirely encapsulate said semiconductor means, wire means, and at least a portion of said metal lead means, (d) curing said plastic in said cavity to provide the sole housing for said semiconductor means and associated wire means and a portion of said metal lead means, and (e) opening said mold and removing the plastic encapsulated device therefrom.

2. In a method for manufacturing a semiconductor device which includes positioning a semiconductor element and associated wire means and metal leads for such device on a portion of a transfer-mold having a plurality of metal parts fitting together, and encapsulating the assembly in a transfer-mold by only one molding operation for the complete encapsulation, the steps of, (a) jigging a plurality of individual metal leads in one mold portion of the multiportion-transfer-mold wherein separable parts thereof have matching grooves for receiving each of said leads over a length such that an end section of each projects from that mold portion, (b) fastening said one mold-portion parts together in a closed face-to-face contact with each other, whereby to maintain the metal leads in a fixed position in matching grooves and to seal matching grooves with said metal leads against any plastic leakage at said mold-part faces and at said grooves during a plastic-transfer-molding operation, (c) mounting a semiconductor element on the projecting end section of at least one of said leads while it is maintained in said one mold-portion, and electrically connecting said element to the projecting end section of each of the remaining leads, (d) assembling together the portions of said multiportion mold, with said assembled mold having a cavity therein which encompasses said semiconductor element and the projecting end section of each of said leads, (e) introducing a molding plastic into said cavity in a transfer molding operation to fill said cavity and entirely surround said element, said projected end section of each of said leads, and the electrical connections, (f) curing said plastic around said element and lead sections having electrical connections thereto to encapsulate all of the same as an assembly and provide such plastic encapsulation as the ultimate sole support as well as the sole housing for the assembly, (g) and opening said mold and removing the completed plastic encapsulated semiconductor device therefrom.

3. In a method of fabricating a semiconductor device in a transfer mold having a plurality of metal mold portions and encapsulating the device in a single-step plastic-transfer-molding operation, the steps of, (a) positioning the elements of said device on a first mold portion, (b) maintaining said elements on said first mold portion mechanically connected together for ultimate electrical operation in the completed device, (c) closing the first mold portion and a second mold portion of said multiportion mold to provide a cavity in said transfer mold encompassing the assembled semiconductor device elements on said first mold portion, (d) performing only one molding operation with plastic material in the complete method, with said one plastic molding operation comprising introducing a molding plastic into said cavity through a bore and gate in one of said two mold portions in a transfer-molding operation to fill said cavity and entirely surround said elements therein, (e) curing said plastic around said elements to encapsulate the same and provide such plastic encapsulation as the ultimate sole support as well as the sole housing for the same, and (f) opening said transfer mold and removing the completed plastic encapsulated semiconductor device therefrom.

4. In the method of claim 3, wherein the plurality of mold portions comprises two portions with the first mold portion upon which the semiconductor device elements are assembled acting to position such elements for such assembly, and wherein said one of said two mold portions is in a position such that the plastic material is introduced into the latter and therethrough under pressure to the cavity, and the cavity in said transfer mold encompasses the assembled device elements on the first metal mold portion.

5. In a method for manufacturing a plastic encapsulated semiconductor device which includes assembling a plurality of elements therefor on a portion of a transfer mold having a plurality of metal parts fitting together, and which includes only one molding operation with plastic material in the complete method, the steps of, (a) jigging the plurality of elements in the metal part mold portion of the transfer mold, (b) bringing said metal parts of said one mold portion together in a closed face-to-face contact with each other whereby to maintain the jigged elements in a fixed position therein, (c) mounting on a jigged element a semiconductor element as one of said plurality of elements in said assembly and affixing to said semiconductor element tiny wires as other of said elements to electrically connect said semiconductor element into the assembly, (d) assembling together the portions of said multiportion mold, with said assembled mold having a cavity in one portion thereof which encompasses said semiconductor element, said tiny wires, and said assembly of said elements, (e) introducing a molding plastic into said cavity in a transfer molding operation to fill said cavity and entirely surround said assembly, with said molding operation being the only plastic molding in the complete method, (f) curing said plastic around said assembly to encapsulate the same and provide such plastic encapsulation as the ultimate sole support as well as the sole housing for the assembly, (g) and opening said mold and removing the completed plastic encapsulated semiconductor device therefrom.

6. A method for manufacturing a plurality of plastic encapsulated semiconductor devices which employs a two portion metal transfer mold, which utilizes one portion of the metal transfer mold for the handling of the parts for the plurality of semiconductor devices during the transfer molding step, and which introduces plastic under pressure in the other portion of the metal transfer mold to encapsulate the parts in plastic in the only plastic molding practiced in the method, including the steps of, (a) placing on said one mold portion of the transfer mold semiconductor device parts including semiconductor means, metals leads and tiny wires for each of said plurality of semiconductor devices to be manufactured, and with said parts in assembled position for each device on said one portion, (b) bringing together the two portions of the metal transfer mold for a single molding operation in the method, with semiconductor device parts on said one mold portion acting to prevent plastic leakage from the transfer mold when the two portions of the mold are together in a closed position and when heated plastic is introduced under pressure into the other mold portion of said closed transfer mold, (c) introducing plastic under pressure into a bore in said other portion of the mold when the transfer mold is closed, and transferring said plastic from the bore through a gate and into a cavity in said closed transfer mold to completely encapsulate with plastic each assembly of semiconductor device parts including the semiconductor means, a portion of each metal lead and tiny wires connected thereto for each such assembly, curing said plastic in said transfer mold into a device structure for each of the plurality of devices wherein plastic serves as the complete housing for each of said semiconductor ports to maintain them permanently in the original assembled position for a device.

7. The method of claim 6, wherein each said metal lead has a flattened portion at one end thereof and all said flattened portions are at the same corresponding end of said metal leads, with each semiconductor means mounted on one of said flattened portions, and with tiny wires respectively connecting said semiconductor means and the flattened portion on each of said other metal leads associated with said each semiconductor means.

8. The method of claim 7, wherein the cured plastic serves in an ultimate completed plastic encapsulated device as the sole support for the assembled semiconductor device parts as well as the complete housing therefor.

References Cited

UNITED STATES PATENTS

| | | | |
|---|---|---|---|
| 1,626,118 | 4/1927 | Olin et al. | 29—25.13 |
| 2,720,617 | 10/1955 | Sardella | 264—272 X |
| 2,794,211 | 6/1957 | Brown et al. | 18—5 |
| 2,876,499 | 3/1959 | Schultz | 264—277 |
| 2,888,736 | 6/1959 | Sardella | 264—272 X |
| 3,084,391 | 4/1963 | Parstorfer | 264—272 X |
| 3,092,522 | 6/1963 | Knowles et al. | 29—583 X |
| 3,117,349 | 1/1964 | Woods | 264—272 X |
| 3,187,240 | 6/1965 | Clark. | |

OTHER REFERENCES

Journal of Society of Plastics Engineers, vol. 18, No. 1, January 1962, pp. 87–89.

WILLIAM I. BROOKS, *Primary Examiner.*